(12) United States Patent
Rachmady et al.

(10) Patent No.: US 10,431,690 B2
(45) Date of Patent: Oct. 1, 2019

(54) HIGH ELECTRON MOBILITY TRANSISTORS WITH LOCALIZED SUB-FIN ISOLATION

(71) Applicant: Intel Corporation, Santa Clara, CA (US)

(72) Inventors: Willy Rachmady, Beaverton, OR (US); Matthew V. Metz, Portland, OR (US); Gilbert Dewey, Hillsboro, OR (US); Chandra S. Mohapatra, Beaverton, OR (US); Jack T. Kavalieros, Portland, OR (US); Anand S. Murthy, Portland, OR (US); Tahir Ghani, Portland, OR (US); Nadia M. Rahhal-Orabi, Lake Oswego, OR (US); Sanaz K. Gardner, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/575,111

(22) PCT Filed: Jun. 26, 2015

(86) PCT No.: PCT/US2015/038069
§ 371 (c)(1),
(2) Date: Nov. 17, 2017

(87) PCT Pub. No.: WO2016/209278
PCT Pub. Date: Dec. 29, 2016

(65) Prior Publication Data
US 2018/0158957 A1    Jun. 7, 2018

(51) Int. Cl.
*H01L 29/786* (2006.01)
*H01L 29/06* (2006.01)
(Continued)

(52) U.S. Cl.
CPC .... *H01L 29/78609* (2013.01); *H01L 29/0673* (2013.01); *H01L 29/42392* (2013.01);
(Continued)

(58) Field of Classification Search
CPC .......... H01L 29/78609; H01L 29/0673; H01L 29/42392; H01L 29/66522;
(Continued)

(56) References Cited

U.S. PATENT DOCUMENTS 8,896,101 B2 * 11/2014 Then ..................... H01L 29/772
257/615
9,786,765 B2 * 10/2017 Nowak ............. H01L 29/66545
(Continued)

OTHER PUBLICATIONS

International Search Report and Written Opinion for International Patent Application No. PCT/US15/38069, dated Mar. 28, 2016.
(Continued)

*Primary Examiner* — Fernando L Toledo
*Assistant Examiner* — Neil R Prasad
(74) *Attorney, Agent, or Firm* — Green, Howard & Mughal LLP

(57) ABSTRACT

Crystalline heterostructures including an elevated fin structure extending from a sub-fin structure over a substrate. Devices, such as III-V transistors, may be formed on the raised fin structures while silicon-based devices (e.g., transistors) may be formed in other regions of the silicon substrate. A sub-fin isolation material localized to a transistor channel region of the fin structure may reduce source-to-drain leakage through the sub-fin, improving electrical isolation between source and drain ends of the fin structure. Subsequent to heteroepitaxially forming the fin structure, a portion of the sub-fin may be laterally etched to undercut the fin. The undercut is backfilled with sub-fin isolation material. A gate stack is formed over the fin. Formation of the
(Continued)

sub-fin isolation material may be integrated into a self-aligned gate stack replacement process.

20 Claims, 10 Drawing Sheets

(51) Int. Cl.
    *H01L 29/66*     (2006.01)
    *H01L 29/78*     (2006.01)
    *H01L 29/423*     (2006.01)

(52) U.S. Cl.
    CPC .. *H01L 29/66522* (2013.01); *H01L 29/66742* (2013.01); *H01L 29/66795* (2013.01); *H01L 29/785* (2013.01); *H01L 29/78681* (2013.01); *H01L 29/78696* (2013.01)

(58) Field of Classification Search
    CPC ......... H01L 29/66742; H01L 29/66795; H01L 29/785; H01L 29/78681; H01L 29/78696
    See application file for complete search history.

(56) References Cited

U.S. PATENT DOCUMENTS

| | | |
|---|---|---|
| 2010/0258870 A1 | 10/2010 | Hsu et al. |
| 2011/0068414 A1 | 3/2011 | Anderson |
| 2013/0307038 A1 | 11/2013 | Toh et al. |
| 2014/0203334 A1 | 7/2014 | Colinge et al. |
| 2015/0064855 A1 | 3/2015 | Cheng et al. |
| 2015/0126001 A1 | 5/2015 | Vellianitis et al. |

OTHER PUBLICATIONS

Extended European Search Report dated Jan. 22, 2019 for European Patent Application No. 15896564.0.
International Preliminary Report on Patentability for International Patent Application No. PCT/US15/38069, dated Jan. 4, 2018.

* cited by examiner

HIGH ELECTRON MOBILITY TRANSISTORS WITH LOCALIZED SUB-FIN ISOLATION

BACKGROUND

Demand for integrated circuits (ICs) in portable electronic applications has motivated greater levels of semiconductor device integration. Many advanced semiconductor devices in development leverage non-silicon semiconductor materials, including compound semiconductor materials (e.g., GaAs, InP, InGaAs, InAs, and III-N materials). These non-silicon material systems may be employed in high electron mobility transistors (HEMT), some of which may be metal oxide semiconductor field effect transistors (MOSFET).

One technique for fabricating high electron mobility transistors includes forming a non-silicon crystalline device region (e.g., a transistor channel region) over an intermediate supporting structure comprising a material distinct from that of the channel device region and the substrate. Materials for the device region and an underlying sub-structure may form a heterostructure. Even where the heterostructure demarks a boundary between complementary semiconductor materials (e.g., an n-type channel region disposed on a p-type sub-channel region), transistors utilizing the channel region may exhibit relatively poor short channel effect (SCE). Device architectures that further reduced SCE in such devices are therefore desirable.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
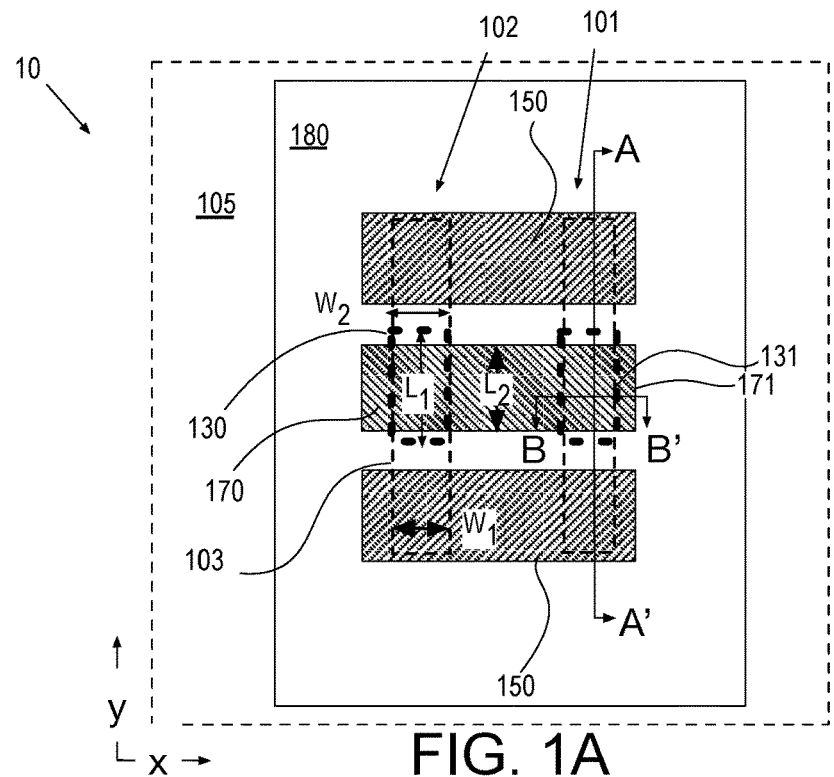
FIG. 1A is a plan view of a System-on-Chip (SoC) including a pair of non-silicon transistors with heteroepitaxial sub-fin isolation disposed over a silicon substrate, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are exemplary embodiments of heteroepitaxial structures including an elevated crystalline fin structure extending from a crystalline sub-fin structure over a crystalline substrate. Using heteroepitaxial growth techniques to form the sub-fin and fin structures, non-silicon devices (e.g., III-V channel field effect transistors), may be formed in raised crystalline fin structures extending over a first region of a silicon substrate. Silicon devices (e.g., silicon channel field effect transistors) may be formed in other regions of the silicon substrate. In some embodiments, a sub-fin isolation material is formed in a manner localized to below a non-silicon transistor channel region of the fin structure. This isolation material may reduce leakage current between source and drain that would otherwise pass through the crystalline sub-fin material. Greater electrical isolation between source and drain ends of the fin structure may improve the SCE of a non-silicon transistor utilizing fin material as a gate electrode-coupled conduction channel.

Notably, some embodiments of the highly localized sub-fin isolation structures described herein may be more manufacturable than less-localized isolation structures, such as silicon-on-insulator (SOI) substrates that may require layer transfer and/or wafer bonding. Embodiments of the sub-fin isolation material structures described herein also have advantages over junction isolation structures, which generally require implants that are difficult to control for current transistor architectures, and also typically introduce significant parasitic capacitance.

In some embodiments, to form sub-fin isolation structures a portion of crystalline sub-fin material may be laterally etched, undercutting crystalline fin material subsequent to heteroepitaxially forming the crystalline fin material from a seeding surface of the sub-fin. The undercut may be back-filled with the sub-fin isolation material. A gate stack may then be formed over the fin, landing on the sub-fin isolation material or a surrounding field dielectric material. In some embodiments, formation of the sub-fin isolation is integrated into a self-aligned gate stack replacement process to improve non-silicon transistor performance with little additional fabrication complexity.

FIG. 1A is a plan view of a System-on-Chip (SoC) 10 including a pair of non-silicon transistors 101 and 102 with sub-fin isolation 130, in accordance with some embodiments. Non-silicon transistors 101 and 102 are N-type (NMOS) and disposed over a silicon substrate 105. SoC 10 may further include P-type (and N-type) silicon-based MOSFETs (not depicted) disposed over a second substrate surface region. Each transistor 101, 102 includes a non-silicon monocrystalline heteroepitaxial fin (hetero-fin) structure 103 having a shortest length in a first dimension (e.g., x) and a longest length in a second dimension (e.g. y). As described further elsewhere herein, hetero-fin structure 103 includes a device layer, referred to herein as the "fin," disposed on a support, referred to herein as the "sub-fin." In some embodiments, transistors 101 and 102 are substantially identical structures configured into electrical parallel for greater current carrying capacity. A single gate electrode stack 170 forms a first stripe extending in the x-dimension over a channel region of the fin in hetero-fin structures 103. Source/drain contact metallization 150 forms second stripes extending in the x-dimension to couple to source and drain ends of the fin in hetero-fin structures 103.

In some embodiments, a sub-fin isolation material has a lateral dimension parallel to a source-drain length of the hetero-fin structure that is at least as large as a length of the fin channel region over which the gate electrode stack is disposed. In the example of FIG. 1A, hetero-fin structures 103 are illustrated in thin dashed line to indicate they are substantially covered by an overlying interlayer dielectric material 180, gate stack 170, and source/drain contact metallization 150. Sub-fin isolation 130 is illustrated in thick dashed line. As visible from the plan view, sub-fin isolation 130 is localized to a channel region of hetero-fins 103 that is electrostatically coupled to gate electrode stack 170. Sub-fin isolation material 130 may be considered a sub-fin "source/drain" isolation structure localized to only a portion of the sub-fin structure sufficient to reduce a source-drain conduction path through the sub-fin portion of hetero-fins 103.

As shown in FIG. 1A, sub-fin isolation material 130 has a lateral length $L_1$ in the γ-dimension that is larger than a length $L_2$ of gate stack 170. A region of hetero-fin 103 referred to herein as the "channel region" is located where the gate stack length $L_2$ contacts underlying fin material. In some embodiments, sub-fin isolation material has a lateral dimension orthogonal to the source-drain length of the fin (x-dimension) that is substantially equal to a width of the fin. In the example of FIG. 1A, hetero-fin 103 has a fin width $W_1$ and sub-fin isolation material 130 has a lateral width $W_2$ that is substantially equal to fin width $W_1$. As described further below, lateral width $W_2$ may be controlled as a function of how sub-fin isolation material 130 is integrated with the fabrication of other transistor components, such as gate electrode stack 170. Sub-fin isolation structures in accordance with some embodiments, for example, may be readily integrated into a gate replacement process such that edges of a sub-fin isolation structure may be self-aligned to sidewalls of a hetero-fin, or may be self-aligned to sidewalls of a gate electrode stack.

Figure 1B:
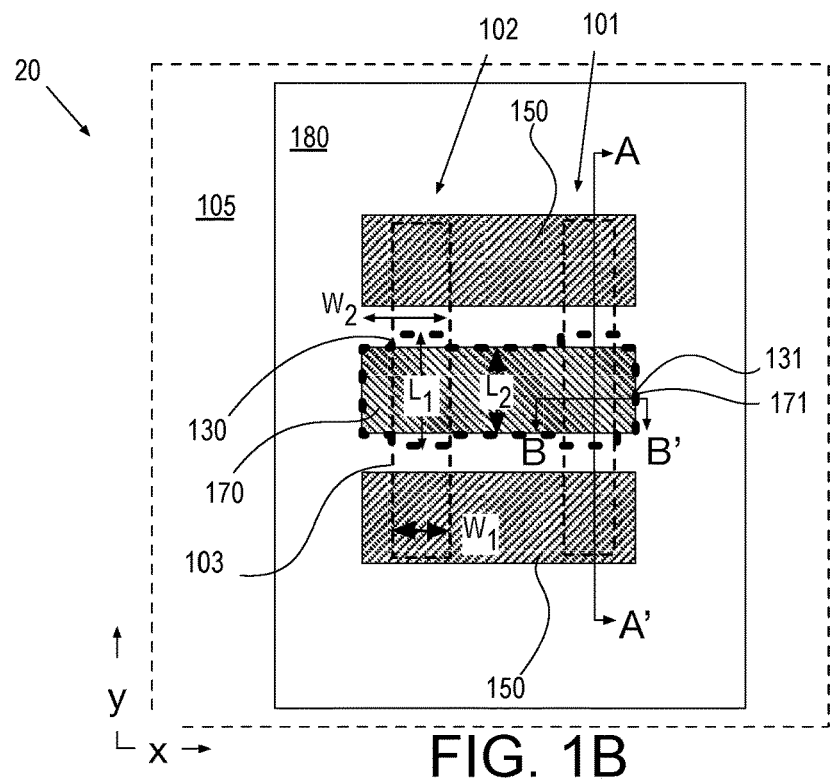
FIG. 1B is a plan view of a System-on-Chip (SoC) including a pair of non-silicon transistors with heteroepitaxial sub-fin isolation disposed over a silicon substrate, in accordance with some embodiments.

FIG. 1B is a plan view of a System-on-Chip (SoC) 20 including a pair of non-silicon transistors 101 and 102 with sub-fin isolation 130, again disposed over a substrate 105. In embodiments exemplified by FIG. 1B, sub-fin isolation 130 has a lateral width $W_2$ that is significantly larger than fin width $W_1$ with a portion of sub-fin isolation material 130 extending beyond opposite sidewalls of hetero-fin 103. In some embodiments, sub-fin isolation material 130 extends beyond opposite sidewalls of hetero-fin 103 by substantially the same amount as does gate electrode stack 170. In other words, gate electrode stack edge 171 is aligned with sub-fin isolation material edge 131. As also illustrated in FIG. 1B, sub-fin isolation structure 130 comprises a continuous stripe of amorphous isolation material intersecting the plurality of fin structures to separate each fin channel region from a crystalline sub-fin material that might otherwise conduct significant leakage current.

Figure 2A:
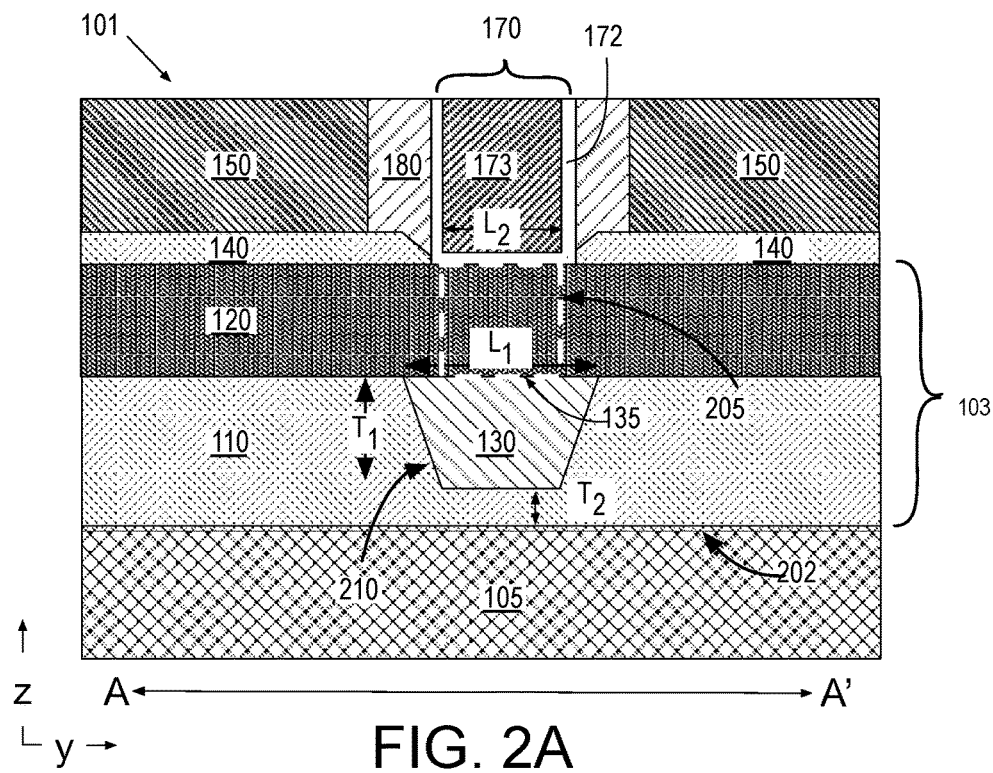
FIG. 2A illustrates a cross-sectional view through a length of a channel region and source/drain regions of a transistor depicted in FIG. 1A or FIG. 1B, in accordance with some embodiments.
Figure 2B:
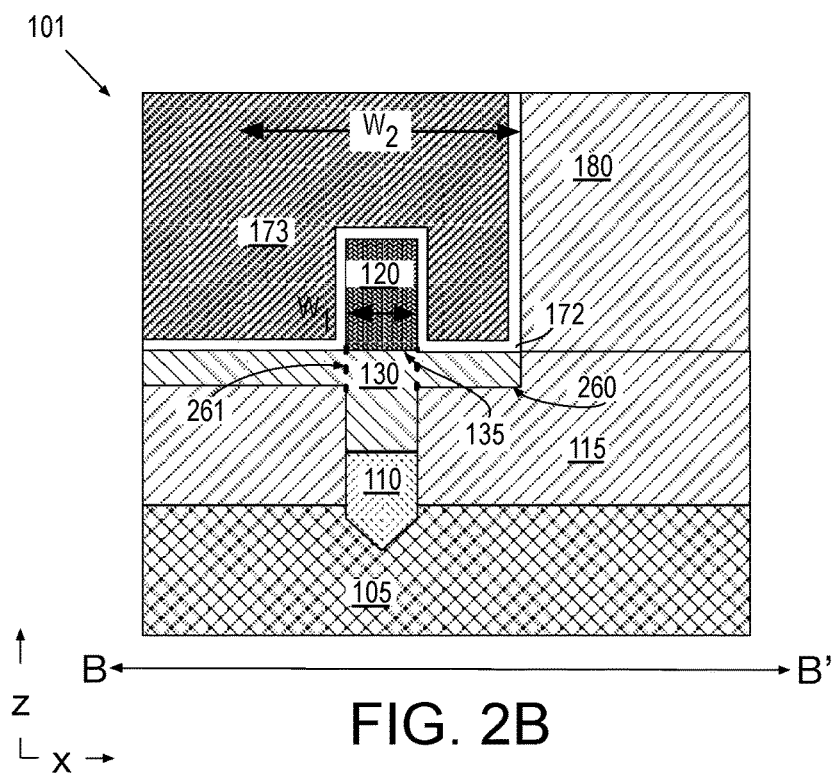
FIG. 2B illustrates a cross-sectional view through a width of a channel region and a gate electrode of a transistor depicted in FIG. 1B, in accordance with some embodiments.

FIG. 2A illustrates a cross-sectional view through a length of a channel region and source/drain regions of transistor 101 along the A-A' line depicted in FIG. 1A, in accordance with some embodiments. FIG. 2B illustrates a cross-sectional view through a width of a channel region and a gate electrode of transistor 101 along the B-B' line depicted in FIG. 1A, in accordance with some embodiments. Referring first to FIG. 2A, a length of hetero-fin 103 is disposed on a monocrystalline substrate 105. Hetero-fin 103 includes a monocrystalline sub-fin material 110 that is disposed on substrate 105, and a monocrystalline fin material 120 that is disposed on sub-fin material 110. At source/drain ends of hetero-fin 103, raised doped source/drain material 140 is disposed on crystalline fin material 120. Alternatively, raised doped source/drain material 140 is disposed on fin material 110 (e.g., where ends of fin material 120 has been removed and regrown). Raised doped source/drain material 140 may be any material suitable for ohmic contact to fin material 120, such as, but not limited to, InAs. In some embodiments, raised doped source/drain material 140 is single crystalline. Contact metallization 150 is in contact with raised doped source/drain material 140 and is electrically isolated from gate stack 170 by interlayer dielectric 180 and/or lateral spacers of gate dielectric 172.

In some advantageous embodiments, substrate 105 is silicon (Si), which is advantageous for monolithic integration of III-V MOS transistor 101 with conventional silicon-channeled MOSFETs, for example with the III-V MOS transistor 101 being an NMOS device and the silicon MOSFET being a PMOS device to enable CMOS integrated circuitry. Crystallographic orientation of a substantially monocrystalline substrate 105 in exemplary embodiments is (100), (111), or (110). However, other crystallographic orientations are also possible. For example, the substrate working surface may be miscut, or offcut 2-10° toward [110], to facilitate nucleation of heteroepitaxial sub-fin material 110. Other substrate embodiments are also possible, with examples including silicon-carbide (SiC), sapphire, a III-V compound semiconductor (e.g., GaAs), a silicon on insulator (SOI) substrate, germanium (Ge), or silicon-germanium (SiGe).

Sub-fin material 110 may help to accommodate lattice mismatch between the materials selected for fin material 120 and substrate 105, and/or provide junction isolation fin material 120 and substrate 105. In some embodiments, sub-fin material 110 is a material other than that of the substrate, with the interface between them being a first heterojunction associated with hetero-fin 103. For example, where substrate 105 is silicon, sub-fin material 110 is a material other than silicon. In some silicon substrate embodiments, sub-fin material 110 a first group III-V compound semiconductor material (e.g., GaAs, InP, InAs, InGaAs, AlGaAs, GaP, AlAs, InGaP).

In some embodiments, fin material 120 is to serve as a device layer, for example including the carrier conduction channel region denoted in FIG. 2A by dashed lines 205. Channel region 205 is to be modulated through the field effect applied by an overlying gate electrode 173. Fin material 120 comprises a material other than that of the sub-fin material 110, with the interface between them being a second heterojunction associated with hetero-fin 103. In some embodiments, fin material 120 is a second group III-V compound semiconductor material (e.g., GaAs, InP, InAs, InGaAs, AlGaAs, GaP, AlAs, InGaP). The two hetero-fin materials may also be of complementary dopant type (e.g., a p-type III-V sub-fin and an n-type III-V fin).

Although exemplary III-V fin structures and finFET embodiments are employed consistently herein for the sake of clarity of discussion, it is expected one of skill in the art familiar with the characteristics of alternate semiconductor material systems will be able to successfully apply the techniques described herein to other heteroepitaxial fin structures absent some specific a priori knowledge of a salient incompatibility between the exemplary III-V embodiments and the alternate material systems. For example, alternative non-silicon material systems, such as but not limited to, the III-N material system (e.g., AN, GaN, AlGaN, InAlGaN) may also be amenable to the techniques and architectures described herein.

As further illustrated in FIG. 2A and FIG. 2B, sub-fin isolation material 130 is disposed immediately below channel region 205, occupying a recess in sub-fin material 110 that extends across the hetero-fin width. As illustrated in FIG. 2B, sub-fin isolation material 130 has a lateral width that is at least equal to fin width $W_1$. Channel region 205 is therefore completely separated from the sub-fin material 110 by sub-fin isolation material 130. In some embodiments denoted in FIG. 2B by dashed lines 261, sub-fin isolation material 130 has opposite sidewalls or edges substantially aligned with sidewalls or edges of fin material 120 (and sub-fin material 110). In other embodiments also illustrated by FIG. 2B, sub-fin isolation material 130 has a sidewall or edge substantially aligned with sidewall or edge of gate stack 170 (e.g., aligned with gate dielectric 172 and/or gate electrode 173 depending on technique employed to form gate stack 170). For the later embodiment, sub-fin isolation material 130 forms an interface 260 with dielectric trench material 115. As such, both sub-fin material 110 and sub-fin isolation material 130 may be embedded within dielectric trench material 115.

In some embodiments, sub-fin material 110 may be bifurcated by sub-fin isolation material 130 such that fin material 120 is essentially disposed on two distinct crystalline sub-fin portions (not depicted). In the exemplary embodiment illustrated in FIG. 2A, sub-fin material 110 remains continuous over the length of fin material 120 with sub-fin isolation material 130 having a maximum z-thickness of $T_1$ while sub-fin material 110 necks-down to a minimum z-thickness of $T_2$. As sub-fin leakage is a function of resistance through sub-fin material 110, thickness $T_1/T_2$ may be selected to achieve any desired reduction in sub-fin source/drain current. In advantageous embodiments, $T_1$ is at least equal to $T_2$, and more advantageously greater than $T_2$. The introduction of sub-fin isolation material 130 contacting crystalline fin surface 135 of fin material 120 may render surface leakage the dominant mode of source/drain leakage. In some embodiments therefore, length $L_1$ of the surface 135 contacting sub-fin isolation material 130 is at least equal to channel region length $L_2$, and is advantageously greater than $L_2$.

Figure 3A:
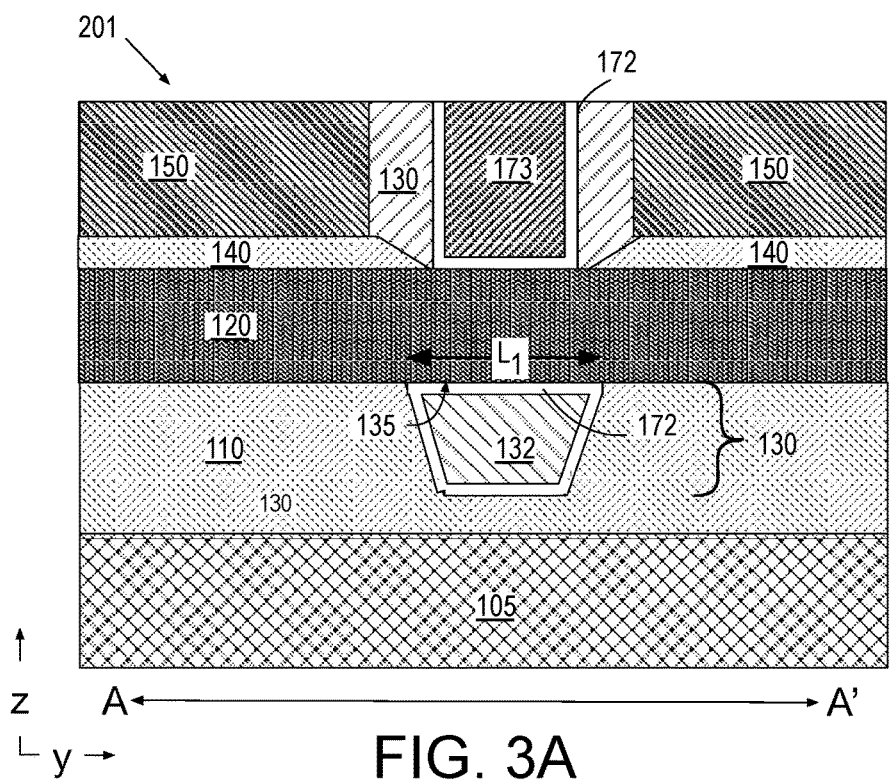
FIG. 3A illustrates a cross-sectional view through a length of a transistor channel region and source/drain regions of a transistor depicted in FIG. 1A or FIG. 1B, in accordance with some embodiments.

Surface leakage is also a function of the surface states present along crystalline fin surface 135. Sub-fin isolation material 130 may therefore be selected to best passivate crystalline fin surface 135. In some embodiments, sub-fin isolation material 130 is a dielectric, such as, but not limited to silicon oxides (e.g., $SiO_2$, or siloxane derivatives), or polymer dielectrics(e.g., benzocyclobutene, porous methyl silsesquioxane). In some embodiments, sub-fin isolation material 130 comprises a composite dielectric film stack including more than one material layer. FIG. 3A illustrates a cross-sectional view through a length of a transistor channel region and source/drain regions of transistor 201 along the A-A' line substantially as depicted in FIG. 1A, in accordance with some embodiments. In this exemplary embodiment, sub-fin isolation material 130 includes both gate dielectric material 172 and a bulk-fill dielectric material 132. Gate dielectric material 172 forms a low-leakage interface 135 with crystalline fin material 120. Bulk-fill dielectric material 132 backfills any remain recess in crystalline sub-fin material 110. Gate dielectric material 172 may be any known to be suitable for the composition of fin material 120, such as, but not limited to a metal oxide (e.g., $Al_2O_3$, $HFO_2$, etc.). Bulk-fill dielectric material 132 may be any conventional material, or a low-k material having a relative dielectric constant less than 2.5. For example, bulk-fill dielectric material 132 may be any of silicon oxides (e.g., $SiO_2$, or siloxane derivatives), polymer dielectrics (e.g., benzocyclobutene, porous methyl silsesquioxane), or the like. Although the structure illustrated in FIG. 3A shares some features of a nanowire or gate-all-around transistor architecture, gate metal 173 does not back fill the sub-fin recess, and gate dielectric 172 is employed merely as a surface passivation. The presence of bulk-fill dielectric material 132 ensures low gate electrode fringe capacitance, in part by ensuring gate metal 173 does not backfill any recess not sealed by gate dielectric 172.

Figure 3B:
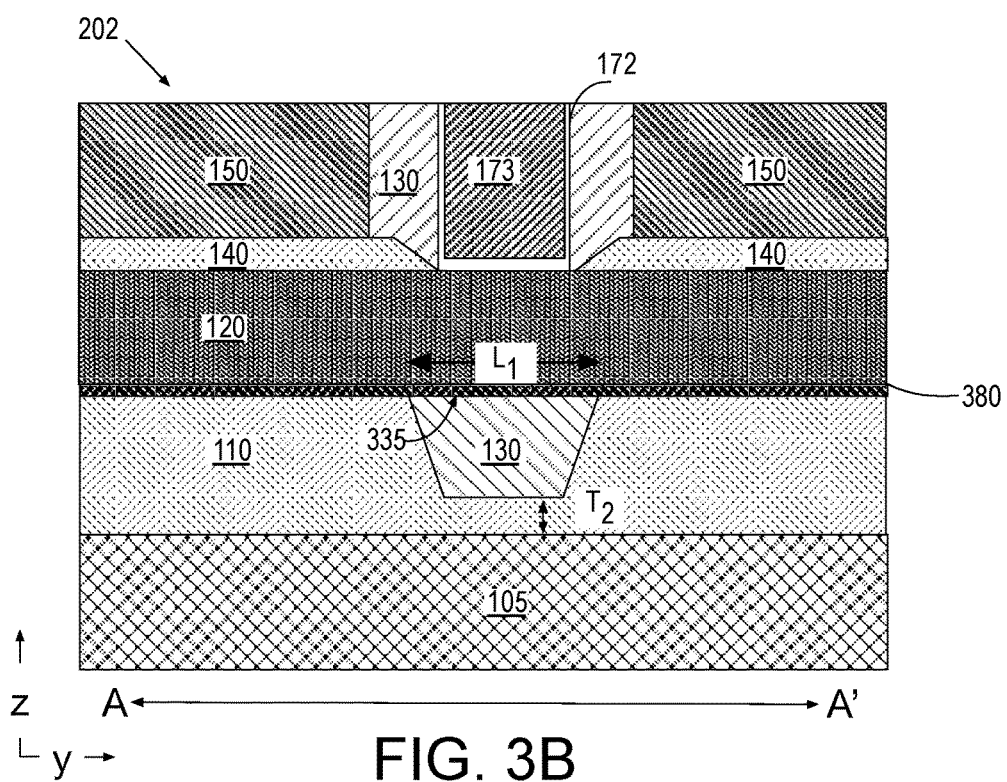
FIG. 3B illustrates a cross-sectional view through a length of a transistor channel region and source/drain regions of a transistor depicted in FIG. 1A or FIG. 1B, in accordance with some embodiments.

In some embodiments, a hetero-fin structure further includes a monocrystalline interfacial material between the device layer and sub-fin. This interfacial material may be selected to facilitate forming a low leakage interface with a sub-fin isolation material. FIG. 3B illustrates a cross-sectional view through a length of a transistor channel region and source/drain regions of transistor 202 along the A-A' line substantially as depicted in FIG. 1A (or FIG. 1B), in accordance with some embodiments. As shown in FIG. 3B, monocrystalline interfacial material 380 is retained as part of crystalline fin material 120. The composition of interfacial material 380 may be selected to have a large carrier band offset from that of the crystalline fin material. For example, some embodiments where fin material 120 comprises InGaAs, interfacial material 380 may be AlAs, AlGaAs, or GaP. Interfacial material 380 may further have a z-thickness significantly less than the z-thickness of sub-fin material 110, and in some embodiments is significantly less than even minimum sub-fin z-thickness $T_2$. Source/drain leakage through interfacial material 380 may then be insignificant. Indeed, interfacial material 380 may be so thin (e.g., only 1-3 nm) as to be carrier depleted. Leakage at fin/isolation interface 335 may then be insignificant. Similar to embodiments where sub-fin isolation incorporates a passivation material, embodiments including crystalline interfacial material 380 may utilize a wide variety of dielectric materials to back-fill fill the sub-fin material 110. For example, sub-fin isolation dielectric may be any conventional or low-k material, such as but not limited to silicon oxides (e.g., $SiO_2$, or siloxane derivatives), or polymer dielectrics(e.g., benzocyclobutene, porous methyl silsesquioxane), and/or metal oxides as a function of other integration choices.

Returning to FIG. 2A, in some embodiments sub-fin isolation 130 forms an interface with one or more sub-fin crystallographic facets 210. As described further below, sub-fin crystallographic facets 210 are indicative of a highly chemical etchant capable of undercutting fin material 120. As further illustrated in FIG. 2B, sub-fin material 110 is further recessed below a level of dielectric trench material 115 surrounding sub-fin material 110, for example functioning as field isolation. For some embodiments where sub-fin isolation material 130 extends beyond fin material width $W_1$, sub-fin isolation material has a greater z-thickness below fin material 120 than where sub-fin isolation material 130 extends beyond fin material 120. As described further below, this feature, along with the gate stack edge alignment, is indicative of recess etching sub-fin material 110 and back-filling the recess with sub-fin isolation material 130 during a gate-replacement process.

Figure 4:
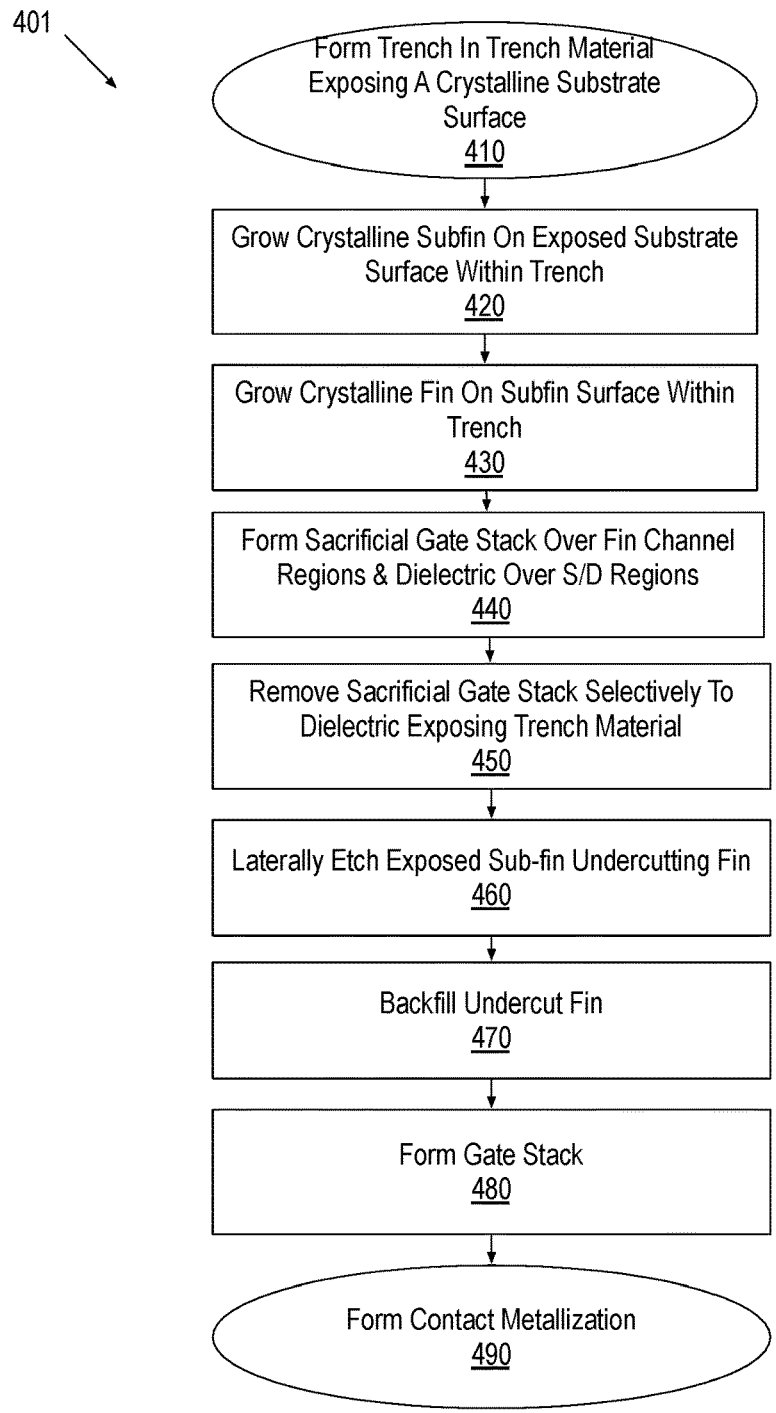
FIG. 4 is a flow diagram illustrating a method of fabricating a transistor with localized sub-fin isolation, in accordance with some embodiments.
Figure 5A:
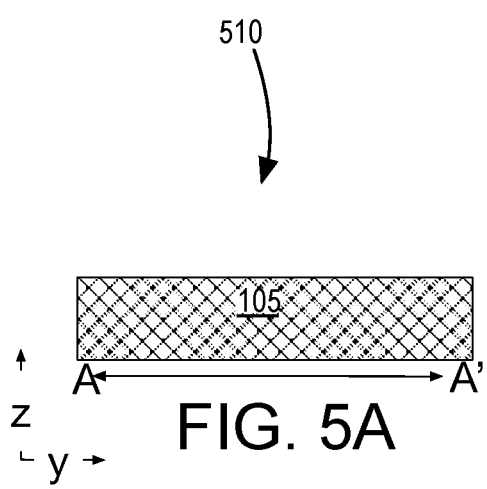
FIGS. 5A, 6A, 7A, 8A, 9A, 10A, 11A, 12A, 13A, 14A, 15A, and 16A are cross-sectional views depicting a length of a channel region and source/drain regions of a transistor with localized sub-fin isolation evolving as the method illustrated in FIG. 4 is performed, in accordance with some embodiments.
Figure 5B:
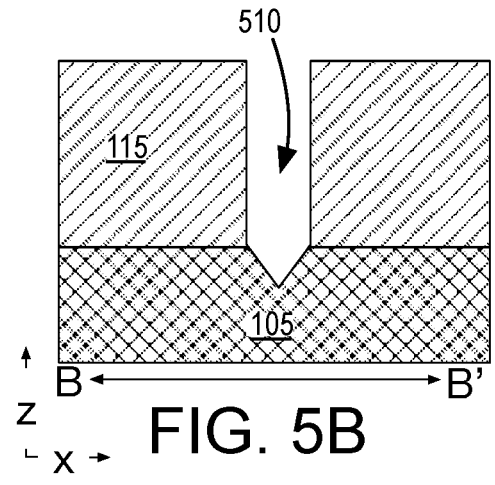
FIGS. 5B, 6B, 7B, 8B, 9B, 10B, 11B, 12B, 13B, 14B, 15B, and 16B are cross-sectional views depicting a width of a channel region and gate electrode of a transistor with localized sub-fin isolation evolving as the method illustrated in FIG. 4 is performed, in accordance with some embodiments.
Figure 6A:
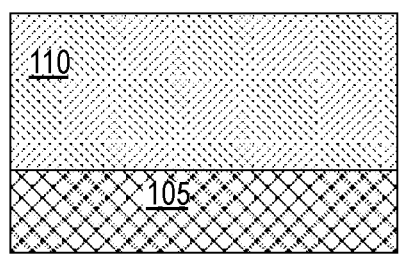
Figure 6B:
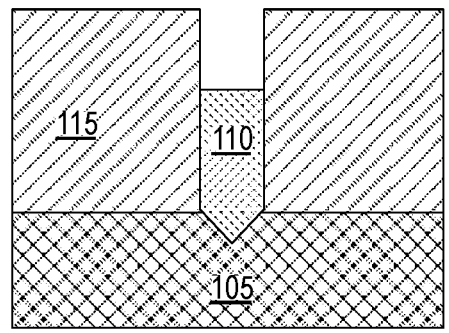
Figure 7A:
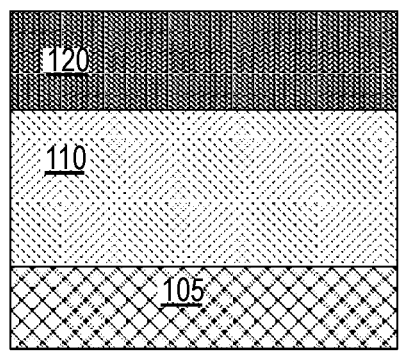
Figure 7B:
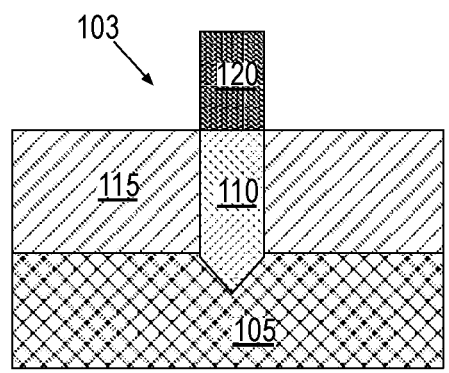
Figure 8A:
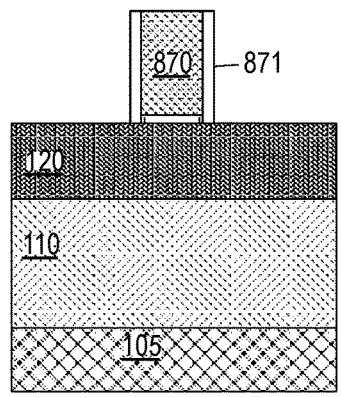
Figure 8B:
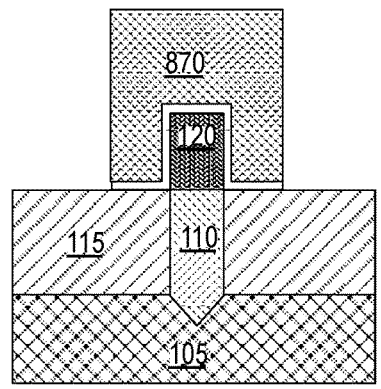
Figure 9A:
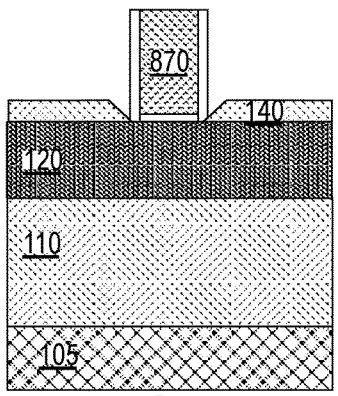
Figure 9B:
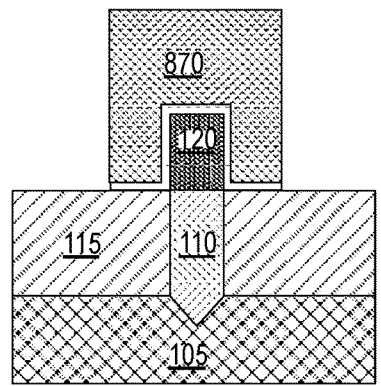
Figure 10A:
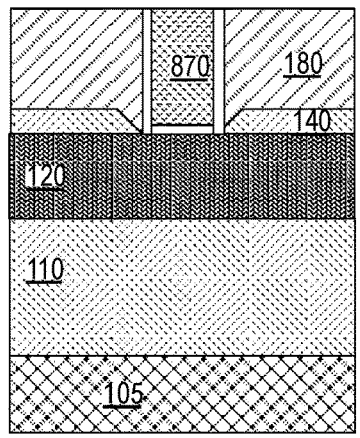
Figure 10B:
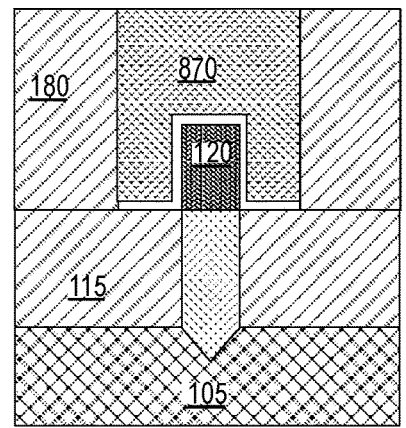
Figure 11A:
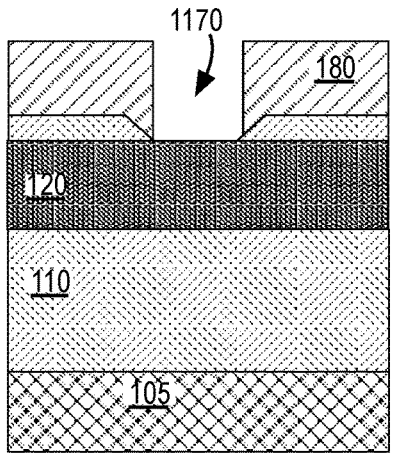
Figure 11B:
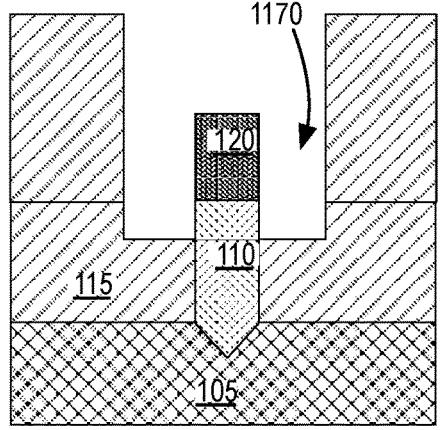
Figure 12A:
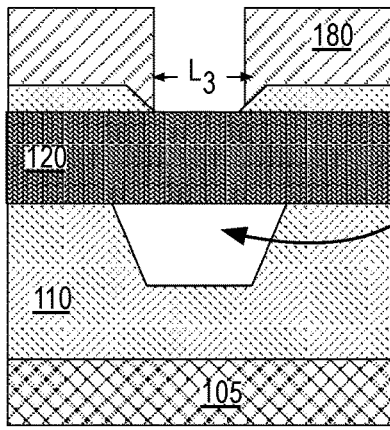
Figure 12B:
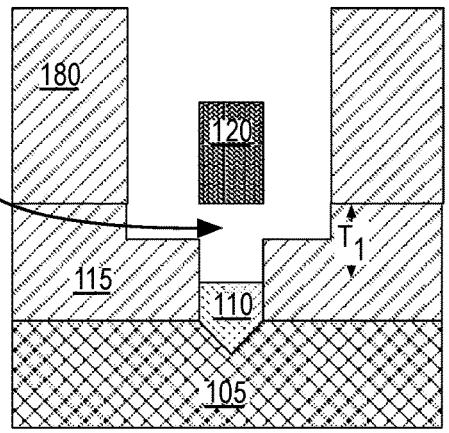
Figure 13A:
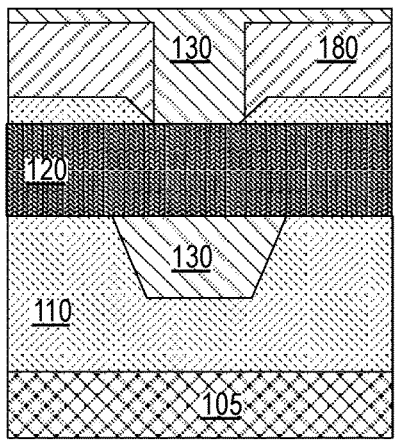
Figure 13B:
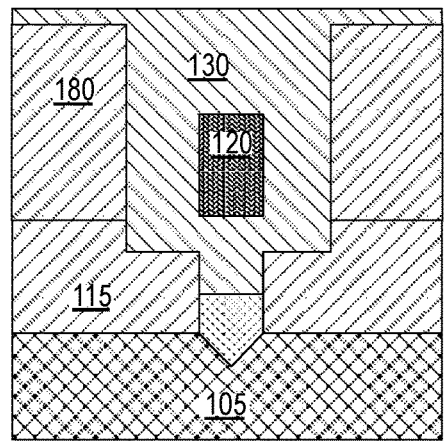

The hetero-fin structures with localized sub-fin isolation and transistors incorporating them described above may be fabricated by a variety of methods applying a variety of techniques. FIG. 4 is a flow diagram illustrating a method 401 for fabricating a non-silicon field effect transistor with localized sub-fin isolation, in accordance with some embodiments. Method 401 may be utilized to form the transistors 101, 102 (FIG. 1A), for example. FIGS. 5A, 6A, 7A, 8A, 9A, 10A, 11A, 12A, 13A, 14A, 15A, and 16A are cross-sectional views depicting a length of a channel region and source/drain regions of a transistor with localized sub-fin isolation evolving as the method illustrated in FIG. 4 is performed, in accordance with some embodiments. FIGS. 5B, 6B, 7B, 8B, 9B, 10B, 11B, 12B, 13B, 14B, 15B, and 16B are cross-sectional views depicting a corresponding width of the channel region and gate electrode of a transistor with localized sub-fin isolation evolving as the method illustrated in FIG. 4 is performed, in accordance with some embodiments.

Method 401 begins with forming a heteroepitaxial fin structure. In the exemplary embodiment, aspect ratio trapping (ART) is utilized to achieve acceptable crystal quality in the heteroepitaxial fin material. The ART technique described herein in the context of operations 410, 420 and 430 is an example of additive heteroepitaxial fin fabrication, which may advantageously reduce the effects of thermal mismatch across various heterojunctions. In alternative embodiments, a conventional subtractive technique may be employed in which a blanket epitaxial film stack grown over the substrate or bonded/transferred to the substrate is etched into fin structures similarly amenable to subsequent operations of method 401 where localized sub-fin isolation material is introduced.

The ART process begins at operation 410 where a trench is formed in a trench material disposed over a substrate. The trench may be etched completely through a z-thickness of the trench material, exposing a crystalline substrate surface that is to seed a subsequent epitaxial growth. In the exemplary embodiment illustrated in FIGS. 5A, 5B, a trench 510 is anistropically etched into trench material 115, exposing a portion of substrate 105 at the bottom of trench 510. In some embodiments, the exposed portion of substrate 105 is recessed etched. In the illustrated example, a recess with positively sloped sidewalls is etched into substrate 105, which may further enhance trapping of crystalline defects (e.g., dislocations) in a subsequently grown crystalline sub-fin material. Trench material 115 may be any dielectric material known suitable as a field isolation or shallow trench isolation material, such as, but not limited to silicon dioxide. Although dimensions of trench 510 may vary, the aspect ratio (z-depth:y-dimension) is advantageously at least 2:1 and more advantageously 3:1, or more. In some embodiments, trench 510 has a CD of between 10 and 200 nm. However, trench material z-thickness and CD may be scaled as needed to maintain a workable aspect ratio for a predetermine fin height selected for a desired transistor current carrying width.

Returning to FIG. 4, method 401 continues at operation 420 where the monocrystalline sub-fin is epitaxially grown from the substrate surface exposed at the bottom of the trench formed at operation 410. Any epitaxial growth technique, such as, but not limited to, metal-organic chemical vapor deposition (MOCVD), molecular beam epitaxy (MBE), or hydride vapor phase epitaxy (HVPE) may be utilized at operation 410. In the exemplary embodiment illustrated in FIGS. 6A, 6B, sub-fin material 110 is epitaxially grown selectively to the substrate seeding surface to partially back fill trench 510.

At operation 430 (FIG. 4), feed gases and other epitaxial process control parameters (e.g., temperature, partial pressures, etc.) are changed to epitaxially grow fin material from the sub-fin surface still contained within the trench. Operations 420 and 430 may be performed in a continuous manner with an in-situ change in growth parameters. In further embodiments where an intervening interfacial material is to be included in the hetero-fin structure, operation 420 may further include multiple growth parameter/feed gas changes following any known technique. After epitaxial fin growth, the surrounding trench material may be recessed to a desired level to expose sidewalls of the fin material. In the exemplary embodiment illustrated in FIGS. 7A and 7B, trench material 115 is recess etched (e.g., with a blanket timed etch). More or less of hetero-fin 103 may be exposed during recess etch of trench material 115. In the illustrative embodiment, trench material 115 is recessed sufficiently to fully expose fin material 120 without exposing sub-fin material 110 in preparation for a raised source/drain regrowth.

Returning to FIG. 4, method 401 continues at operation 440 where a gate stack mandrel is formed over a fin channel region. Any known sacrificial gate structure and fabrication techniques may be employed at operation 440. In some embodiments, operation 440 entails dielectric deposition and planarization, as well as patterning an opening in the dielectric exposing the fin structure, and backfilling the opening with a sacrificial gate. In alternative embodiments, sacrificial gate material is blanket deposited and patterned into gate mandrel stripes. In the example illustrated in FIGS. 8A and 8B, a gate stack mandrel including sacrificial gate material 870 (e.g., polysilicon) is formed over fin material 120 using any conventional technique. Sacrificial gate material 870 is formed on at least two sidewalls of fin material 120 and lands on trench material 115. Spacer dielectric 871 may also be formed using any conventional technique. For the embodiment depicted in FIG. 8B, sacrificial gate material 870 does not cover any portion of sidewalls of sub-fin material 110, but it may as function of how much trench material 115 is recessed. Subsequent to forming the gate mandrel, doped regions are formed at the source/drain ends of fin material 120. In some embodiments, a raised source/drain region is formed by depositing a heavily-doped semiconductor of any composition suitable for fin material 120. In the exemplary embodiment illustrated in FIGS. 9A, 9B, an epitaxial process is employed to form monocrystalline raised source/drain regions 140. An interlayer dielectric (ILD) 180 is then deposited over raised source/drain regions 140 and planarized with the gate mandrel, as further depicted in FIGS. 10A, 10B.

Returning to FIG. 4, method 401 continues at operation 450 where the gate mandrel is removed selectively relative to the surrounding dielectric material, exposing fin material and trench material. Any conventional technique may be used at operation 450 to remove the sacrificial gate material(s). Following gate mandrel removal, exposed trench material may be further recessed, if necessary, to expose at least a portion of sub-fin material. In the example further illustrated in FIGS. 11A, 11B, trench material 115 is recessed to expose portion of sub-fin material 110. This recess is self-aligned to the dimensions of the extracted gate mandrel.

Exposed sub-fin material is laterally etched at operation 460 (FIG. 4) to undercut the exposed fin region. The sub-fin etch is advantageously self-aligned to the dimensions of the extracted gate mandrel. In some embodiments, a crystallographic etchant having selectivity to sub-fin material 110 over fin material 120 is employed at operation 460. In some embodiments, a chemical etchant selective to InP over InGaAs (e.g., hydrochloric acid/water, etc.) undercuts exposed InGaAs fin material and form one or more etch facets in an InP sub-fin material. As further illustrated in FIGS. 12A, 12B the etchant laterally undercuts the fin material 120 forming recess 1230. In some embodiments, the etchant further recesses a portion of the sub-fin material 110 below surrounding trench material 115. In some embodiments, the etchant further laterally undercuts a length of sub-fin 110 that is greater than a length $L_3$ of the gate mandrel.

Returning to FIG. 4, at operation 470 the undercut fin material is backfilled with sub-fin isolation material. Any of the dielectric materials described elsewhere herein may be deposited at operation 470. In some embodiments, the composition of the sub-fin isolation material is distinct from the trench material, facilitating a subsequent selective recessing of the selective sub-fin isolation material. In some embodiments, operation 470 entails depositing metal oxide by ALD or CVD. In some embodiments, operation 470 entails depositing a silicon oxide by CVD. In some embodiments, operation 470 entails a CVD dielectric deposition and reflow process. In the example further illustrated in FIGS. 13A, 13B, sub-fin isolation material 130 completely backfills the recessed sub-fin material 110 and is planarized to a level covering over interlayer dielectric 180.

Figure 14A:
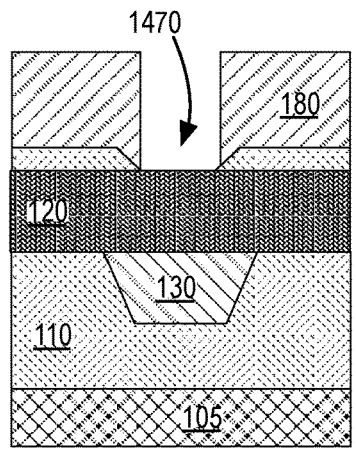
Figure 14B:
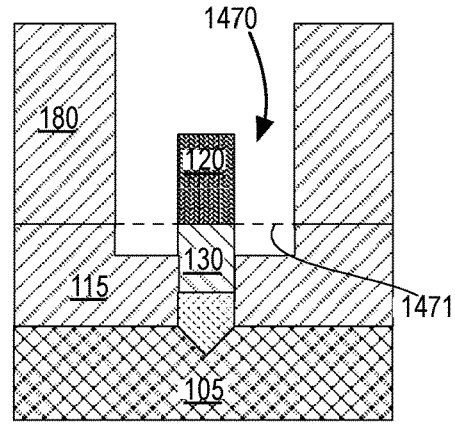

Method 401 (FIG. 4) proceeds to operation 480 where a gate stack is formed over at least two sidewalls of the fin material. In some embodiments, operation 480 entails recessing the sub-fin isolation dielectric material selectively to the surrounding interlayer dielectric to expose a desired portion of the fin material. In the example further illustrated in FIGS. 14A and 14B, isolation material 130 is etched to form a gate stack recess 1470. In some embodiments, isolation material 130 is only partially recessed to the dashed line 1471, exposing only fin material 120. In alternate embodiments, isolation material 130 is more completely removed with any anisotropic etch process known to stop on trench material 115, thereby forming sidewalls of isolation material 130 self-aligned to fin material 120.

Figure 15A:
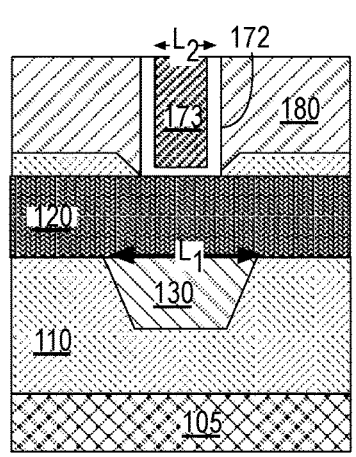
Figure 15B:
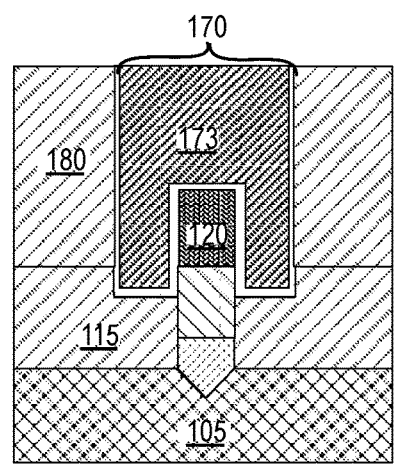

As further illustrated in FIGS. 15A, 15B, a gate stack 170 is deposited into recess 1470. While any known gate stack materials may be utilized, in one exemplary embodiment gate dielectric 172 is a high-k material with a bulk relative dielectric constant of 9, or more. Gate electrode 173 may include any metal with a work function suitable for fin material 120. Any gate stack backfilling process known to be suitable for replacement gate applications may be performed. For the exemplary embodiment where recess 1470 is stopped on trench material 115, gate stack 170 extends passed sidewalls of sub-fin isolation material 130. Because gate stack 170 is self-aligned to sub-fin isolation material 130, the channel region of fin 120 is self-aligned to sub-fin isolation material 130. Gate stack 170 should not significantly couple to sub-fin 110 for at least the reasons that isolation material 130 has a lateral length $L_1$ exceeding length $L_2$ of gate stack 170, and sub-fin material 110 is recessed below trench material 115.

Figure 16A:
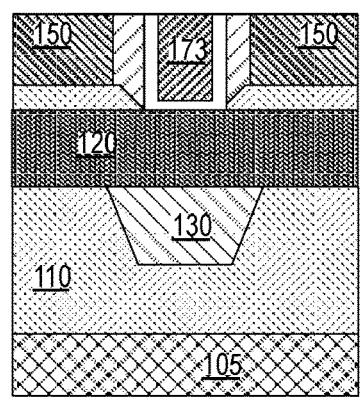
Figure 16B:
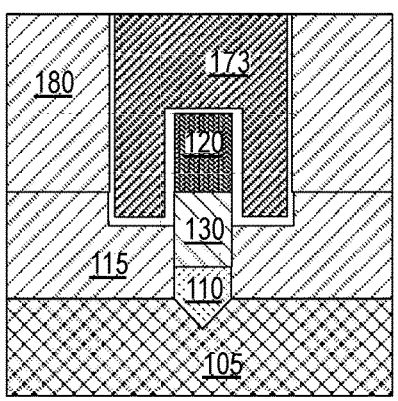

Method 401 (FIG. 4) completes transistor fabrication at operation 490 where contact metallization is deposited onto the source/drain ends of the fin. Operation 490 may entail any conventional metallization processes, for example to form contact metallization 150 on raised source/drain regions 140, as illustrated in FIGS. 16A, 16B. Any conventional backend interconnect metallization may then be employed to form SOC integrated circuitry including a non-silicon transistor with localized sub-fin isolation described above.

Figure 17:
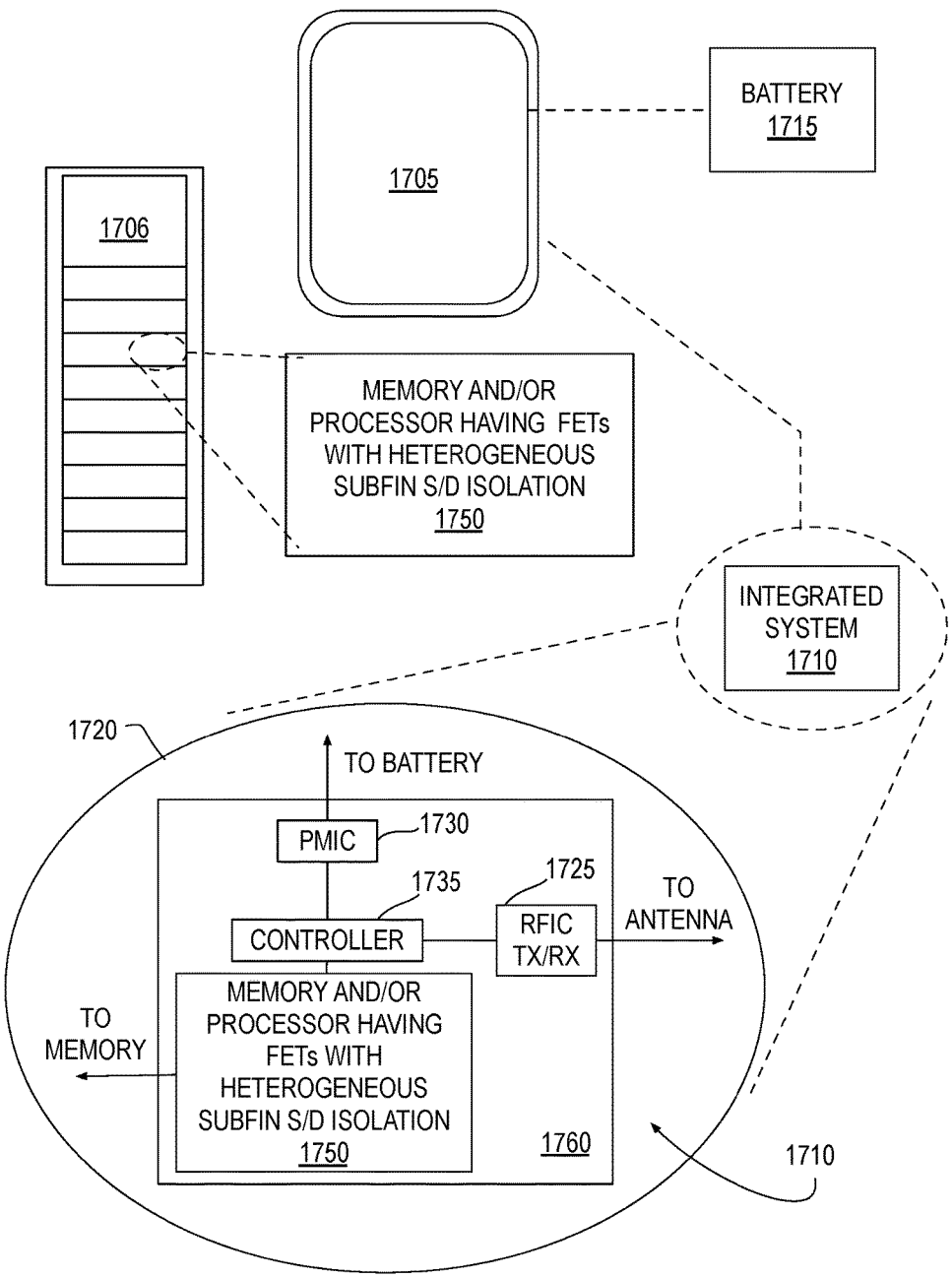
FIG. 17 illustrates a mobile computing platform and a data server machine employing an SoC including a transistor with localized sub-fin isolation, in accordance with embodiments of the present invention.

FIG. 17 illustrates a mobile computing platform and a data server machine employing an SoC including a transistor with localized sub-fin isolation, in accordance with embodiments of the present invention. The server machine 1706 may be any commercial server, for example including any number of high-performance computing platforms disposed within a rack and networked together for electronic data processing, which in the exemplary embodiment includes a packaged monolithic SoC 1750. The mobile computing platform 1705 may be any portable device configured for each of electronic data display, electronic data processing, wireless electronic data transmission, or the like. For example, the mobile computing platform 1705 may be any of a tablet, a smart phone, laptop computer, etc., and may include a display screen (e.g., a capacitive, inductive, resistive, or optical touchscreen), a chip-level or package-level integrated system 1710, and a battery 1715.

Whether disposed within the integrated system 1710 illustrated in the expanded view 1720, or as a stand-alone packaged chip within the server machine 1706, packaged monolithic SoC 1750 includes a memory block (e.g., RAM), a processor block (e.g., a microprocessor, a multi-core microprocessor, graphics processor, or the like) including at least one non-silicon channeled FET (e.g., a III-V channeled FET) with a channel region disposed over a localized isolation material, for example as describe elsewhere herein. The monolithic SoC 1750 may be further coupled to a board, a substrate, or an interposer 1760 along with, one or more of a power management integrated circuit (PMIC) 1730, RF (wireless) integrated circuit (RFIC) 1725 including a wideband RF (wireless) transmitter and/or receiver (TX/RX) (e.g., including a digital baseband and an analog front end module further comprises a power amplifier on a transmit path and a low noise amplifier on a receive path), and a controller 1735.

Functionally, PMIC 1730 may perform battery power regulation, DC-to-DC conversion, etc., and so has an input coupled to battery 1715 and with an output providing a current supply to other functional modules. As further illustrated, in the exemplary embodiment, RFIC 1725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs or integrated into monolithic SoC 1750.

Figure 18:
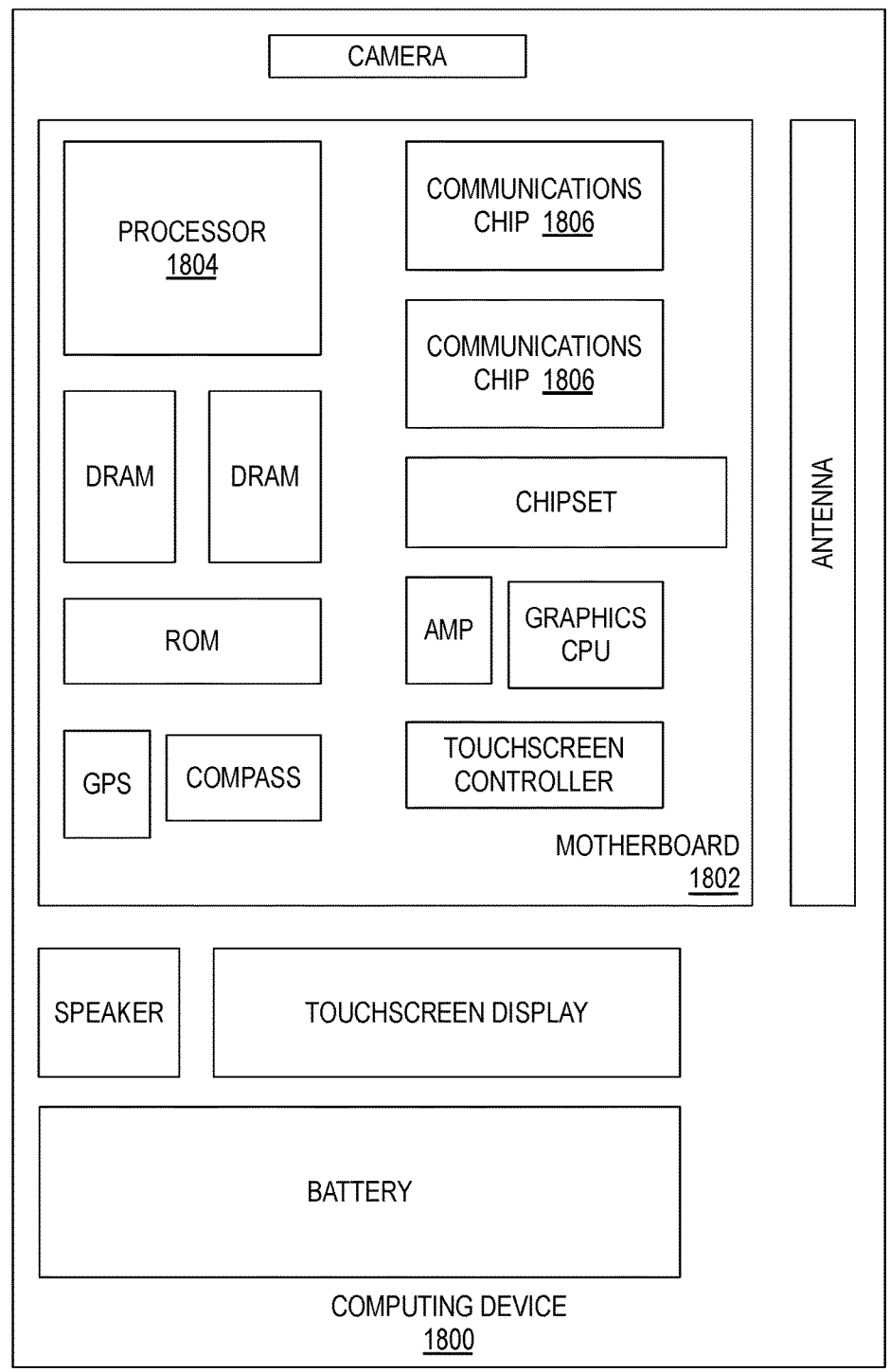
FIG. 18 is a functional block diagram of an electronic computing device, in accordance with an embodiment of the present invention.

FIG. 18 is a functional block diagram of an electronic computing device, in accordance with an embodiment of the present invention. Computing device 1800 may be found inside platform 1705 or server machine 1706, for example. Device 1800 further includes a motherboard 1802 hosting a number of components, such as, but not limited to, a processor 1804 (e.g., an applications processor), which may further incorporate at least one non-silicon (e.g., III-V) channeled FET disposed over a localized isolation material, in accordance with embodiments of the present invention. Processor 1804 may be physically and/or electrically coupled to motherboard 1802. In some examples, processor 1804 includes an integrated circuit die packaged within the processor 1804. In general, the term "processor" or "microprocessor" may refer to any device or portion of a device that processes electronic data from registers and/or memory to transform that electronic data into other electronic data that may be further stored in registers and/or memory.

In various examples, one or more communication chips 1806 may also be physically and/or electrically coupled to the motherboard 1802. In further implementations, communication chips 1806 may be part of processor 1804. Depending on its applications, computing device 1800 may include other components that may or may not be physically and electrically coupled to motherboard 1802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1806 may enable wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1806 may implement any of a number of wireless standards or protocols, including but not limited to those described elsewhere herein. As discussed, computing device 1800 may include a plurality of communication chips 1806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiment, a field effect transistor (FET) comprises a sub-fin structure comprising a first crystalline material disposed over a substrate of a second crystalline material, and an amorphous sub-fin isolation material extending through at least a portion of the crystalline material. The FET further comprises a fin structure comprising a third crystalline material and including a pair of source/drain ends on opposite sides of a channel region, the fin structure extending from the sub-fin structure with the channel region separated from the first crystalline material by the sub-fin isolation material. The FET further comprises a gate electrode stack disposed over the channel, and a pair of source/drain contacts coupled to the pair of source/drain ends of the fin structure.

For at least some of the first embodiments, the sub-fin isolation material has a lateral dimension parallel to a source-drain length of the fin structure that is larger than a length of the channel region over which the gate electrode stack is disposed.

For at least some of the first embodiments immediately above, the sub-fin isolation material occupies a recess in the sub-fin defined by one or more crystallographic facets in the first crystalline material.

For at least some of the first embodiments, the sub-fin structure comprises a fin of the first crystalline material disposed on a surface of the substrate and surrounded by a dielectric trench material disposed over the substrate. The sub-fin isolation material has a first lateral dimension orthogonal to a longest length of the fin that is equal to a width of the fin and a second lateral dimension parallel to the longest length of the fin that is at least equal to a length of the gate electrode stack disposed over the channel region.

For at least some of the first embodiments, the sub-fin structure comprises a fin of the first crystalline material disposed on a surface of the substrate and surrounded by a dielectric trench material disposed over the substrate. The sub-fin isolation material has a first lateral dimension orthogonal to a longest length of the fin that is greater than a width of the fin with a portion of the sub-fin isolation material extending beyond both opposite sidewalls of the fin embedded within the trench material. The gate electrode stack has a second lateral dimension orthogonal to the longest length of the fin structure that is greater than the width of the fin structure with a portion of the gate electrode stack disposed over the sub-fin isolation material. The first and second lateral dimensions are equal with edges of the portion of the gate electrode stack disposed over the sub-fin isolation material aligned with edges of the sub-fin isolation material interfacing with the trench material.

In at least some of the first embodiments immediately above, the sub-fin isolation material has a greater thickness within a region below the fin than in a region extending beyond sidewalls of the fin.

In at least some of the first embodiments, the sub-fin isolation material further comprises the gate dielectric material in contact with the third crystalline material.

In at least some of the first embodiments, the fin structure further comprises a fourth crystalline material disposed between the third and first crystalline materials. The fourth crystalline material is in contact with the first crystalline material at the source/drain ends and in contact with the sub-fin isolation material at the channel region.

In at least some of the first embodiments, the first crystalline material is a first III-V material, the second crystalline material is silicon, and the third crystalline material is a second III-V material. The sub-fin structure comprises a fin of the first crystalline material disposed on a surface of the substrate silicon and disposed within a trench extending through a dielectric trench material disposed over the substrate silicon. The sub-fin isolation material is embedded within the trench material.

In at least some of the first embodiments, the transistor further comprises a raised doped source/drain material in contact with the contact metallization and disposed on one or more sidewalls of the fin structure at the source/drain ends.

In at least some of the first embodiments, the first crystalline material comprises a first of GaAs, InP, InAs, InGaAs, AlGaAs, GaP, AlAs, or InGaP, the second crystalline material is Si, the third crystalline material comprises a second of GaAs, InP, InAs, InGaAs, AlGaAs, GaP, AlAs, or InGaP, and the sub-fin isolation material is a dielectric selected from the group consisting of a metal oxide, a silicon oxide, and an polymer dielectric.

In one or more second embodiments, a microelectronic device comprises a plurality of crystalline sub-fin structures disposed over a crystalline silicon substrate, each sub-fin structure comprising a fin of a first III-V material. The microelectronic device comprises a plurality of crystalline fin structures aligned with the sub-fin structures, each fin structure comprising a second III-V material and including a pair of source/drain ends on opposite sides of a channel region, wherein the second III-V material of one fin structure is in contact with the first III-V material of one sub-fin structure at the source/drain ends. The microelectronic device comprises an amorphous sub-fin isolation material stripe intersecting the plurality of sub-fin structures and fin structures, wherein the sub-fin isolation material stripe separates the second III-V material of each fin structure from the first III-V material at the channel regions. The microelectronic device further comprises a gate electrode stack stripe disposed over, and aligned with, the sub-fin isolation material stripe, wherein the gate electrode stack comprises at least a gate dielectric material and an overlying gate metal, and wherein the gate electrode stack stripe is disposed over the channel region and in contact with at least two sidewalls of each of the fin structures. The microelectronic device further comprises source/drain metallization disposed on opposite sides of the gate electrode stack stripe and coupled to one or more of the source/drain ends.

In at least some of the second embodiments, sub-fin isolation material stripe contacts the silicon substrate within a region where the sub-fin isolation material stripe intersects the fin structure, the sub-fin isolation material stripe separating pairs of the plurality of crystalline sub-fin structures.

In at least some of the second embodiments, the fin structure further comprises a third III-V material disposed over the second III-V material, and the gate electrode stack is in contact with at least two sidewalls of third III-V material with the channel region.

In one or more third embodiments, a method of forming a field effect transistor comprises receiving a crystalline fin comprising a first III-V material disposed on a crystalline sub-fin comprising a second III-V material. The method comprises removing a width of the sub-fin to undercut the fin within a channel region of the fin. The method comprises backfilling the undercut fin channel region with a sub-fin isolation material. The method comprises forming a gate stack over the channel region of the fin. The method comprises forming contact metallization coupled to source/drain ends of the fin.

In at least some of the third embodiments, the method further comprises forming a trench in a trench material, the trench exposing a crystalline substrate surface, heteroepitaxially growing the crystalline sub-fin on an exposed substrate surface within the trench, and heteroepitaxially growing the crystalline fin on a sub-fin surface within the trench.

In at least some of the third embodiments, removing a width of the sub-fin to undercut the fin within a channel region of the fin, further comprises forming a gate stack mandrel over the channel region of the fin and a mask material over the source/drain ends of the fin, removing the gate stack mandrel while retaining the mask material, and isotropically etching the sub-fin while the source/drain ends are protected by the mask material.

In at least some of the third embodiments immediately above, forming the gate stack mandrel further comprises depositing a mandrel material over a sidewall of both the fin and at least a portion of a sidewall of the sub-fin.

In at least some of the third embodiments, isotropically etching the sub-fin further comprises forming etch facets in the sub-fin by exposing the sub-fin to a crystallographic etchant.

In at least some of the third embodiments above, backfilling the undercut fin channel region with the sub-fin isolation material further comprises at least one of spinning on a polymer dielectric, depositing a metal oxide with an atomic layer deposition process, or depositing a silicon oxide with a chemical vapor deposition and reflow process.

In at least some of the third embodiments above, forming the gate stack over the channel region of the fin further comprises planarizing the sub-fin isolation material, recessing the sub-fin isolation material to expose sidewalls of the fin while the source/drain ends are protected by the mask material, depositing the gate dielectric material and the gate metal over the recessed sub-fin isolation material and over the exposed fin sidewalls, and planarizing the gate metal with the mask material.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A field effect transistor (FET), comprising:
   a sub-fin structure comprising:
      a fin of a first crystalline material over a surface of a substrate comprising a second crystalline material and surrounded by a dielectric trench material; and a sub-fin isolation material, wherein the sub-fin isolation material is amorphous and extends through at least a portion of the first crystalline material, wherein the sub-fin isolation material has a first lateral dimension orthogonal to a longest length of the fin of the first crystalline material, and the first lateral dimension is larger than a width of the fin of the first crystalline material;
   a fin structure comprising a third crystalline material and including a source and a drain on opposite ends of a channel region, the fin structure extending from the sub-fin structure with the channel region separated from the first crystalline material by the sub-fin isolation material;
   a gate electrode stack over the channel region, wherein at least a gate electrode of the gate electrode stack has a second lateral dimension orthogonal to the longest length of the fin structure that is larger than the width of the fin structure, and a portion of the gate electrode stack extends over the sub-fin isolation material beyond an edge of the fin structure;
   a source contact coupled to the source; and
   a drain contact coupled to the drain.

2. The transistor of claim 1, wherein the sub-fin isolation material has a lateral dimension parallel to a source-drain length of the fin structure that is larger than a length of the channel region covered by the gate electrode stack.

3. The transistor of claim 2, wherein the sub-fin isolation material occupies a recess in the first crystalline material, the recess having one or more crystallographic facets in the first crystalline material.

4. The transistor of claim 1, wherein:
   the sub-fin structure comprises a fin of the first crystalline material that is over the substrate and is surrounded by a dielectric trench material that is over the surface of the substrate; and
   the sub-fin isolation material has a first lateral dimension orthogonal to a longest length of the fin of the first crystalline material that is equal to a width of the fin of the first crystalline material, and has a second lateral dimension parallel to the longest length of the fin of the first crystalline material that is at least equal to a length of the gate electrode stack that is over the channel region.

5. The transistor of claim 1, wherein:
   the first and second lateral dimensions are equal with a first sidewall of the gate electrode stack aligned with a second sidewall of the sub-fin isolation material that interfaces with the trench material.

6. The transistor of claim 1, wherein the sub-fin isolation material has a greater thickness within a region below the fin structure than in a region extending beyond sidewalls of the fin structure.

7. The transistor of claim 1, wherein the gate stack comprises a gate electrode and a gate dielectric material, and the gate dielectric material is between the gate electrode and a portion of the sub-fin isolation material that extends beyond sidewalls of the fin structure.

8. The transistor of claim 1, wherein:
   the fin structure further comprises a fourth crystalline material between the third and first crystalline materials;
   the fourth crystalline material is in contact with the first crystalline material at the source and drain and is in contact with the sub-fin isolation material within the channel region.

9. The transistor of claim 1, wherein:
   the first crystalline material comprises a first III-V material;
   the second crystalline material comprises silicon; and
   the third crystalline material comprises a second III-V material;

the sub-fin structure comprises a fin of the first crystalline material that is over the second crystalline material and is located within a trench that extends through a dielectric trench material, which is also over the second crystalline material; and the sub-fin isolation material is embedded within the trench material.

10. The transistor of claim 1, wherein the source and the drain further comprise a semiconductor material comprising impurity dopants, wherein the semiconductor material comprising impurity dopants is in contact with the contact metallization and is on a sidewall of the fin structure.

11. The transistor of claim 1, wherein:
the first crystalline material comprises a first alloy of: GaAs; InP; InAs; InGaAs; AlGaAs; GaP; AlAs; or InGaP;
the second crystalline material comprises Si;
the third crystalline material comprises a second alloy of: GaAs; InP; InAs; InGaAs; AlGaAs; GaP; AlAs; or InGaP; and
the sub-fin isolation material comprises a metal oxide, a silicon oxide, or a polymer dielectric.

12. A microelectronic device, comprising:
a plurality of sub-fin structures over a crystalline substrate, each sub-fin structure comprising a fin of a first crystalline III-V material and the crystalline substrate comprising silicon;
a plurality of fin structures aligned with the sub-fin structures, each fin structure comprising a second crystalline III-V material and coupled to a source and drain on opposite ends of a channel region, wherein the second crystalline III-V material of one fin structure is in contact with the first crystalline III-V material of one sub-fin structure at the source or drain;
an amorphous sub-fin isolation material stripe intersecting the plurality of sub-fin structures and fin structures, wherein the sub-fin isolation material stripe separates the second crystalline III-V material of each fin structure from the first crystalline III-V material at the channel regions;
a gate electrode stack stripe over the sub-fin isolation material stripe, wherein the gate electrode stack comprises at least a gate dielectric material and an overlying gate metal, and wherein the gate electrode stack stripe is over the channel region and in contact with a sidewall of each of the fin structures; and
contact metallization on opposite sides of the gate electrode stack stripe and coupled to the source and drain.

13. The device of claim 12, wherein sub-fin isolation material stripe contacts the crystalline substrate within a region where the sub-fin isolation material stripe intersects the fin structure.

14. The device of claim 12, wherein the fin structure further comprises a third crystalline III-V material over the second crystalline III-V material, and the gate dielectric material is in contact with a sidewall of third crystalline III-V material with the channel region.

15. A method of forming a field effect transistor, the method comprising:
receiving a fin comprising a first III-V material on a sub-fin comprising a second III-V material;
removing a width of the sub-fin to undercut the fin within a channel region of the fin, wherein the removing comprises:
forming a gate stack mandrel over the channel region of the fin and a mask material over the ends of the fin adjacent to the gate stack mandrel;
removing the gate stack mandrel while retaining the mask material; and
etching the sub-fin while the ends of the fin are protected by the mask material;
backfilling the undercut fin channel region with a sub-fin isolation material;
forming a gate stack over the channel region of the fin; and
forming a source and a drain coupled to the channel region of the fin.

16. The method of claim 15, further comprising:
forming a trench in a trench material, the trench exposing a crystalline substrate surface;
heteroepitaxially growing the sub-fin on an exposed substrate surface within the trench; and
heteroepitaxially growing the fin on a sub-fin surface within the trench.

17. The method of claim 15, wherein forming the gate stack mandrel further comprises depositing a mandrel material over a sidewall of the fin and a portion of a sidewall of the sub-fin.

18. The method of claim 15, wherein isotropically etching the sub-fin further comprises forming etch facets in the sub-fin by exposing the sub-fin to a crystallographic etchant.

19. The method of claim 16, wherein backfilling the undercut fin channel region with the sub-fin isolation material further comprises at least one of:
spinning on a polymer dielectric;
depositing a metal oxide with an atomic layer deposition process; or
depositing a silicon oxide with a chemical vapor deposition and reflow process.

20. The method of claim 15, wherein forming the gate stack over the channel region of the fin further comprises:
planarizing the sub-fin isolation material;
recessing the sub-fin isolation material to expose sidewalls of the fin while the ends of the fin are protected by the mask material;
depositing a gate dielectric material and a gate metal over the recessed sub-fin isolation material and over the exposed fin sidewalls; and
planarizing the gate metal with the mask material.

* * * * *